(12) United States Patent
Bobeczko et al.

(10) Patent No.: US 8,667,851 B2
(45) Date of Patent: Mar. 11, 2014

(54) TOUCH SENSOR MECHANICAL INTERFACE

(75) Inventors: Gregory W. Bobeczko, Geneva, IL (US); Mark Burleson, Elburn, IL (US); David Kinsman, Wheaton, IL (US); Andrew J. Livingston, North Aurora, IL (US)

(73) Assignee: Touchsensor Technologies, LLC, Wheaton, IL (US)

( * ) Notice: Subject to any disclaimer, the term of this patent is extended or adjusted under 35 U.S.C. 154(b) by 0 days.

(21) Appl. No.: 13/537,576

(22) Filed: Jun. 29, 2012

(65) Prior Publication Data

US 2013/0003272 A1    Jan. 3, 2013

Related U.S. Application Data

(60) Provisional application No. 61/502,640, filed on Jun. 29, 2011.

(51) Int. Cl.
*G01N 3/08* (2006.01)
(52) U.S. Cl.
USPC ........................................ 73/818; 73/862.391
(58) Field of Classification Search
USPC ...................... 73/760, 818, 862.381, 862.391
See application file for complete search history.

(56) References Cited

U.S. PATENT DOCUMENTS

| | | | | |
|---|---|---|---|---|
| 4,016,490 A | * | 4/1977 | Weckenmann et al. | 324/671 |
| 4,927,990 A | * | 5/1990 | Aoki et al. | 200/517 |
| 5,491,904 A | * | 2/1996 | McMurtry | 33/559 |
| RE37,030 E | * | 1/2001 | Lloyd et al. | 33/559 |
| 8,164,354 B2 | * | 4/2012 | Lenz | 324/687 |
| 2006/0012944 A1 | | 1/2006 | Mamigonians | |
| 2012/0222496 A1 | * | 9/2012 | Mamigonians | 73/862.68 |

FOREIGN PATENT DOCUMENTS

| WO | WO 96/13098 | 5/1996 |
|---|---|---|
| WO | WO 03/044958 | 5/2003 |

OTHER PUBLICATIONS

International Search Report and Written Opinion issued in International Patent Application No. PCT/US2012/044764, dated Oct. 8, 2012.

* cited by examiner

*Primary Examiner* — Max Noori
(74) *Attorney, Agent, or Firm* — Barnes & Thornburg LLP

(57) ABSTRACT

A mechanical interface for a touch sensor includes a housing for the sensor, a triggering member for triggering the sensor, and biasing means for biasing the triggering member away from the sensor. Application to the triggering member of a predetermined force overcoming the biasing force causes the triggering member to move toward and into an electric field generated about the sensor, thereby triggering the sensor.

23 Claims, 5 Drawing Sheets

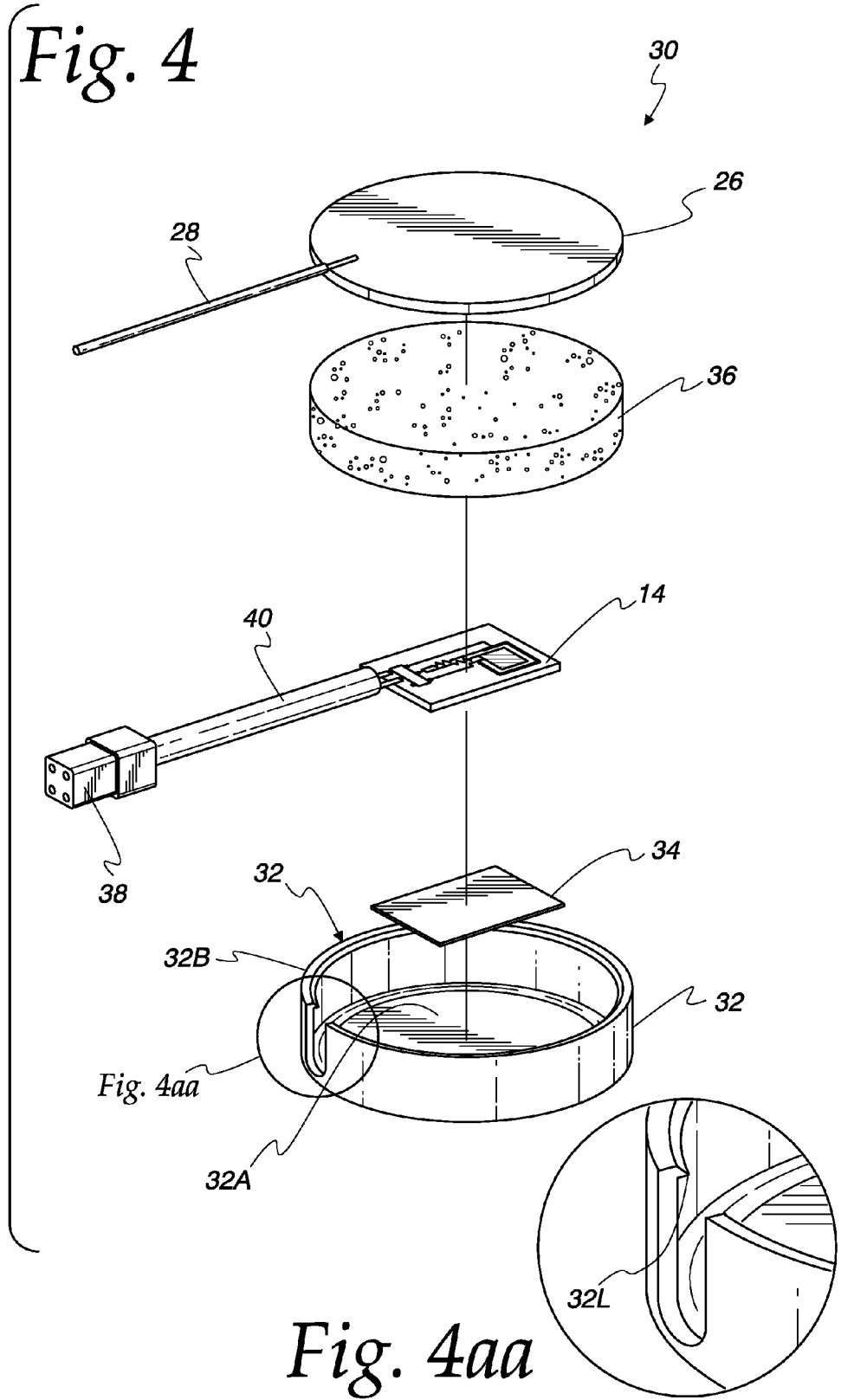

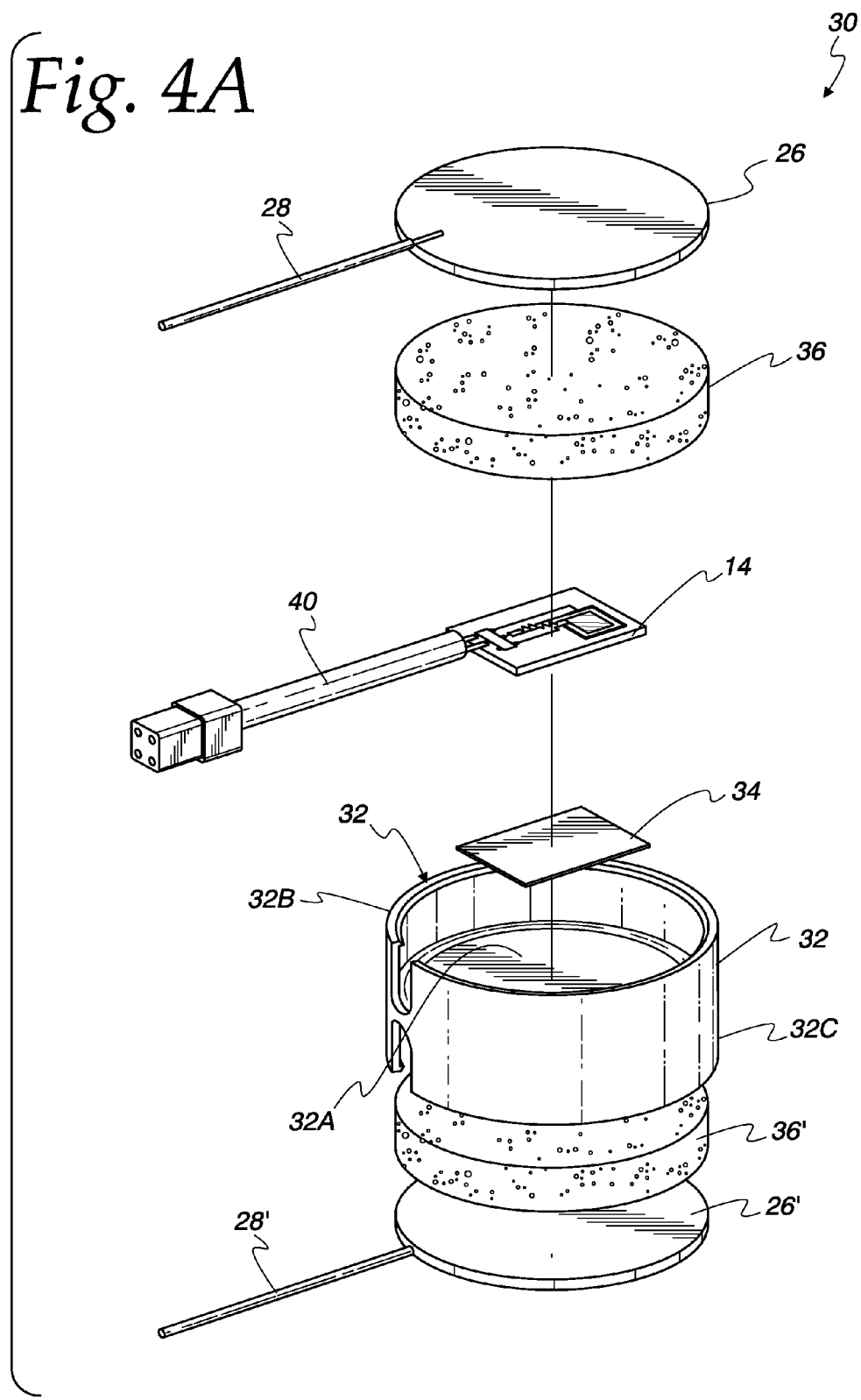

US 8,667,851 B2

TOUCH SENSOR MECHANICAL INTERFACE

CROSS-REFERENCE TO RELATED APPLICATIONS

This application claims priority to U.S. Provisional Patent Application No. 61/502,640, filed on Jun. 29, 2011, and incorporates by reference the disclosure thereof in its entirety.

BACKGROUND OF THE INVENTION

Touch sensors, for example, capacitive sensors and field effect sensors, have long been used as replacements for electromechanical switches. Unlike electro-mechanical switches, which typically include a pair of electrical contacts that can be closed and opened to make and break an electrical circuit, touch sensors typically include one or more sensing electrodes and electronic circuitry to detect and respond to the presence of, for example, a user's fingertip near or at the sensing electrode. Touch sensors can detect the proximity or presence of certain other objects, including certain liquids.

Touch sensors represent an improvement over electromechanical switches in many ways. For one, touch sensors typically have no moving contacts that can wear out. For another, they can be embodied in a form that makes them relatively impervious to adverse environmental effects.

Touch sensors, however, have limited application in that there are some objects or loose, bulk materials that they might not be able to reliably detect. For example, touch sensors might not be able to reliably detect the proximity of coffee beans or other non-conductive objects. As such, touch sensors might not be preferred replacements for other types of switches and sensors adapted to detect such objects.

BRIEF DESCRIPTION OF THE DRAWINGS

FIG. 4 is an exploded perspective view of a touch sensor mechanical interface assembly 30 including a housing 32, an adhesive layer 22, substrate 14 bearing touch sensor 12, a biasing member 36, and a triggering member 26;

FIG. 4aa is a detail view of a lip 32L shown in FIG. 4;

FIG. 4A is an exploded perspective view of a touch sensor mechanical interface assembly 30 including a housing 32, an adhesive layer 22, substrate 14 bearing touch sensor 12, a biasing member 36, a triggering member 26, a second biasing member 36' and a second triggering member 26';

DETAILED DESCRIPTION OF ILLUSTRATED EMBODIMENTS

Figure 1:
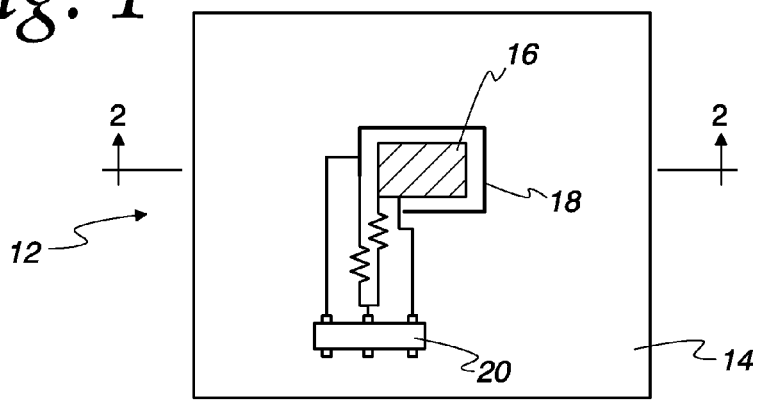
FIG. 1 is a plan view of a touch sensor 12 including sensing electrodes 16,18 disposed on a substrate 14.

FIG. 1 is a plan view of a touch sensor 12 disposed on a dielectric substrate 14. Touch sensor 12 includes a first sensing electrode 16 in the form of a conductive pad and a second sensing electrode 18 substantially surrounding first sensing electrode 16. In other embodiments, first and second sensing electrodes 16, 18 could be in the form of two conductive pads in a side-by-side arrangement or they could be arranged in another suitable manner. Further embodiments could employ a single electrode or could include a strobe electrode in addition to the first and/or second sensing electrodes.

First and second sensing electrodes 16, 18 are coupled to an integral control circuit (ICC) 20 embodied on an integrated circuit disposed in close proximity to first and second sensing electrodes 16, 18. ICC 20 includes field generation and detection circuitry for generating an electric field about first and second sensing electrodes 16, 18 and detecting disturbances thereto due to proximity of a suitable stimulus. In other embodiments, first and second sensing electrodes 16, 18 could be coupled in other manners to other control circuits. Such control circuits could, but need not, be embodied on an integrated circuit proximate the sensing electrodes.

Figure 2:
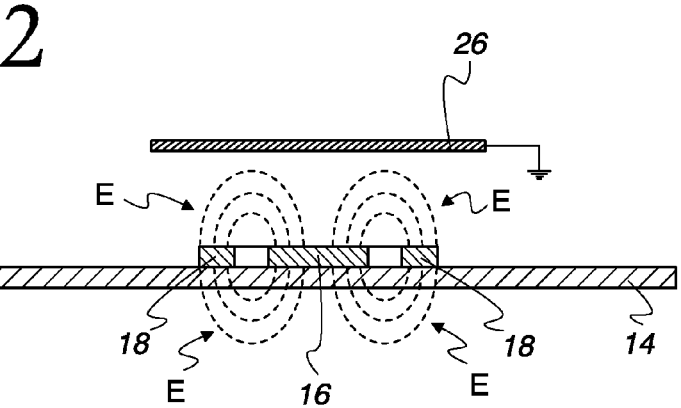
FIG. 2 is a side view of a touch sensor 12 including sensing electrodes 16,18 disposed on a substrate 14, showing an electric field E between electrodes 16, 18, and a triggering member 26 located substantially outside electric field E.
Figure 3:
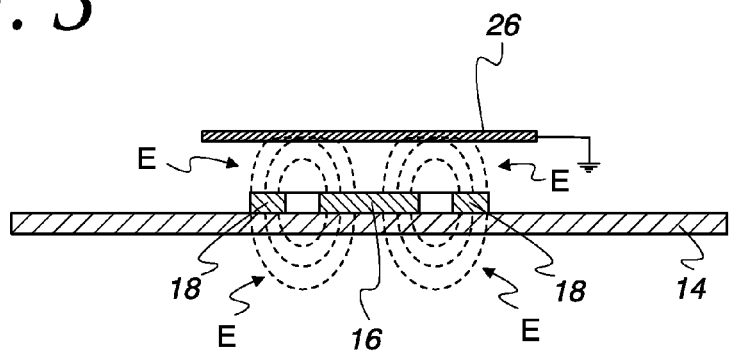
FIG. 3 is a side view of a touch sensor 12 including sensing electrodes 16,18 disposed on a substrate 14, showing an electric field E between electrodes 16, 18, and a triggering member 26 located substantially within electric field E.

FIGS. 2 and 3 are side views of portions of the electrode structure of sensor 12 as shown in FIG. 1. These figures show sensor 12 in an energized state wherein an electric field E is established about electrodes 16, 18. FIGS. 2 and 3 also show a triggering member 26 in operable association with sensor 12. Triggering member 26 preferably takes the form of a conductive plate or other conductive structure. Triggering member 26 is shown as being electrically connected or otherwise coupled to ground. In other embodiments, triggering member 26 could be electrically connected or otherwise coupled to some other reference potential. In further embodiments, such electrical connection or coupling could be omitted, and triggering member 26 could be at a floating potential.

FIG. 2 shows triggering member 26 in a first position relatively far from sensor 12 wherein the electric field E about electrodes 16, 18 does not substantially couple to triggering member 26. FIG. 3 shows triggering member 26 in a second position relatively near to sensor 12 wherein the electric field E about electrodes 16, 18 substantially couples to triggering member 26.

Figure 5:
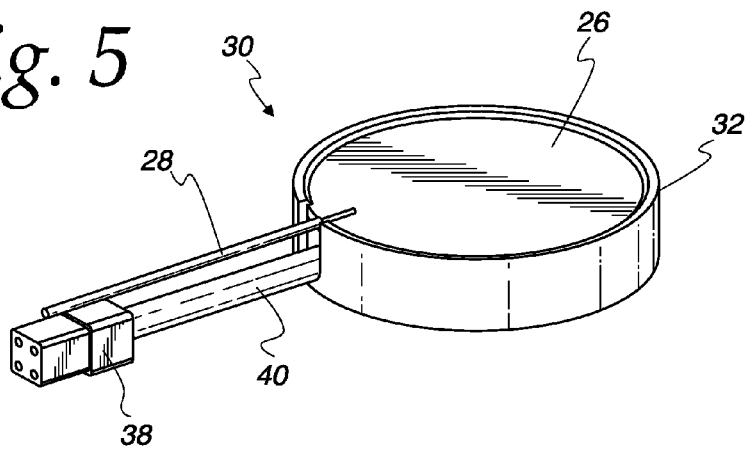
FIG. 5 is a perspective view of touch sensor mechanical assembly 30 showing housing 32 and triggering member 26.

FIGS. 4 and 5 illustrate in exploded and assembled perspective views an embodiment of a touch sensor mechanical interface 30 including a touch sensor 12 disposed on a substrate 14 and a triggering member 26 that is movable with respect to touch sensor 12. Substrate 14 and triggering member 26 are disposed within a housing 32 that preferably is made of plastic or another substantially non-conductive material.

Housing 32 is shown as being generally cylindrical and having a base portion 32A and an annular sidewall or skirt portion 32B extending from the base portion. In other embodiments, housing 32 could have any suitable shape and/or cross section, for example, rectangular, elliptical or irregular. Sidewall 32B could include a lip 32L or other interference geometry for captivating triggering member 26 to housing 32, as would be understood by one skilled in the art. For example, lip 32L is shown in FIGS. 4 and 4aa as including a ramped installation surface to facilitate installation of triggering member 26 to housing 32 and a squared-off retaining surface to retain triggering member 26 or a portion thereof in housing 32 once installed therein.

Substrate 14 can, but need not, be attached to housing 32. As shown in FIG. 4, substrate 14 could be adhered to base portion 32A using an adhesive 34 or other suitable means. Substrate 14 could be attached to housing 32 in other ways, as well, as would be recognized by one skilled in the art.

Conductors coupling sensor 12 or electrodes 16, 18 thereof to external circuitry, for example, a processor or other device, typically would extend from substrate 14. Such conductors can be embodied as discrete wires or as traces borne on a tailpiece 40 extending from or otherwise associated with substrate 14. Tailpiece 40 may be flexible or rigid. Tailpiece 40 can include a connector 38 to facilitate such electrical connections.

Triggering member 26 is shown as a plate made of metal or another conductive material. Alternatively, triggering member 26 could be embodied as a plate or other member made of non-conductive material having a conductive mass disposed therein or thereon. For example, triggering member 26 could be embodied as a plastic plate having a copper or other conductive mass disposed thereon or molded therein.

Triggering member 26 is shown as being of a size and shape that generally conforms to sidewall 32B of housing 32 such that triggering member 26 can move in sliding engagement with an interior surface of housing 32. Such configuration facilitates snap assembly of triggering member 26 to housing 32 and operation therewith. In other embodiments, triggering member 26 could be sized and shaped in different ways and incorporated into interface assembly in different ways. For example, triggering member 26 could be adhered or otherwise attached to biasing member 36 discussed below.

In some embodiments, triggering member 26 could have graphics (not shown) disposed thereon. Such graphics could, for example, provide indication of the functionality of touch sensor mechanical interface 30.

Triggering member 26 can include a tail 28 electrically connecting triggering member 26 to a reference potential, for example, ground. Tail 28 could be made of electrically conductive material, for example, a conductive metal, electrically connecting triggering member 26 to the reference potential. Alternatively, tail 28 could be made of a non-conductive material and carry a wire or other conductor electrically connecting triggering member 26 to the reference potential. For example, tail 28 could be made of plastic and have a conductive wire or trace disposed thereon or molded therein to effect the foregoing connection. Triggering member 26 and the connection thereof to a reference potential could be embodied in other forms, as well. For example, tail 28 could be omitted and triggering member 26 could be electrically coupled to reference potential by means of a simple conductive wire. In further embodiments, triggering member 26 could be at floating potential, obviating the need for a tail or electrical connection thereto.

A biasing member 36 biases triggering member 26 away from substrate 14 and sensor 12. Biasing member 36 is shown as a resilient, compressible foam spacer positioned between sensor 12 and triggering member 26. Biasing member 36 could be embodied in various other forms as well. For example, biasing member 36 could be embodied as a spring. The open end of housing 32 can be over molded with plastic or another suitable material to resist intrusion by water or other liquids or contaminants and to protect the components internal to housing 26 from the environment. The material used to over mold housing 32 preferably would be elastomeric or otherwise sufficiently flexible to allow displacement of triggering member 26 and biasing member 36 in response to an applied force while maintaining the material's ability to resist intrusion by moisture and/or other contaminants into housing 32. One suitable over molding material is thermoplastic polyurethane (TPU).

Biasing member 36 could be designed to allow triggering member 26 to be displaced toward sensor 12 by a predetermined amount in response to a predetermined force applied thereto. For example, in applications where biasing member 36 is embodied as compressible foam, the durometer (hardness), thickness, and cross-sectional area of the foam bearing against triggering member 26 and substrate 14 (and/or base 32A), among other characteristics thereof, could be selected to allow triggering member 26 to be displaced toward sensor 12 by a predetermined amount in response to a predetermined force applied thereto. Similarly, in applications wherein biasing member 36 is embodied as a spring, the characteristics of the spring could be tailored to allow triggering member 26 to be displaced toward sensor 12 by a predetermined amount in response to a predetermined force applied thereto, as would be recognized by one skilled in the art. Biasing member 36, or elements thereof, could, but need not, be conductive. Preferably, triggering member 26 is shaped and sized such that it has sufficient surface area exposed to objects or bulk materials that might be placed thereon to readily carry such objects or materials and transfer the force imparted by them to biasing member 36, as will be discussed further below.

In some embodiments, as shown in FIG. 4A, housing 32 could include a second sidewall 32C on the opposite side of base 32A from sidewall 32B or otherwise be adapted to receive a second triggering member 26'. Such embodiments could include a second biasing member 36' for biasing second triggering member 26' away from touch sensor 12. In such embodiments, biasing member 36 and second biasing member 36' could have substantially similar or dissimilar characteristics. For example, biasing members 36 and 36' could be configured to allow the same degree of displacement or different degrees of displacement in a response to a given normal force applied to triggering members 26 and 26', respectively. Likewise, triggering member 26 and second triggering member 26' could have substantially similar or dissimilar characteristics, such that a given displacement of second triggering member 26' has substantially the same or a substantially different triggering effect on sensor 12 as an equivalent displacement of triggering member 26.

In use, biasing member 36 biases triggering member 26 away from sensor 12 and electric field E generated thereabout. With triggering member 26 positioned sufficiently away from sensor 12 and electric field E, triggering member 26 does not substantially couple to electric field E and, therefore, does not disturb electric field E sufficiently to trigger touch sensor 12, as shown in FIG. 2.

Application of a normal force to triggering member 26 opposite the biasing force exerted against triggering member 26 by biasing member 36 causes triggering member 26 to be displaced toward sensor 12. The magnitude of this displacement is related to the magnitude of the applied force (and the relevant characteristics of biasing member 36). As such, triggering member 26 moves closer to sensor 12 and electric field E as increasing force is applied thereto. Application of a sufficient, predetermined normal force to triggering member 26 will displace triggering member 26 sufficiently close to sensor 12 that triggering member 26 will substantially couple with electric field E, as shown in FIG. 3, and thereby trigger sensor 12.

Conversely, removal of the force will result in biasing member 36 biasing triggering member 26 toward its normal, un-displaced position. As suggested above and as would be recognized by one skilled in the art, the magnitude of force required to displace triggering member 26 sufficiently to couple to electric field E may be a function of the weight and surface area of triggering member 26 and the relevant characteristics of biasing member 36. (Embodiments including second biasing member 36' and second triggering member 26' function similarly, as would be understood by one skilled in the art.)

In an illustrative application, the housing 32 of a touch sensor mechanical interface 30 could be located at the bottom of a container (not shown) to be filled with coffee beans or another bulk material, with base 32A directed to the bottom of the container and triggering member 26 directed up so that the coffee beans could be piled thereon. With the container empty of coffee beans, biasing member 36 biases triggering member 26 to a normal, un-displaced position. As coffee beans are added to the container, they will impart a load on triggering member 26, causing triggering member 26 to be displaced toward sensor 12. Addition of about a predetermined amount of coffee beans to the container will impart a sufficient load to triggering member 26 to displace it such that it couples to electric field E, thereby triggering sensor 12. Removal of coffee beans from the container will have the opposite effect.

Multiple touch sensor mechanical interfaces 30 having different triggering characteristics could be attached to or otherwise located at the bottom of the container or elsewhere, for example, the side wall of the container. The triggering characteristics could be set such that filling the container to a first level would cause triggering member 26 of only a first device 30 to be displaced sufficiently to trigger the corresponding sensor, filling the container to a second level would additionally cause the triggering member 26 of a second device 30 to trigger the corresponding sensor, and so on. In this manner, multiple devices 30 could be used to provide relative indication of the level of fill in the container.

Figure 6:
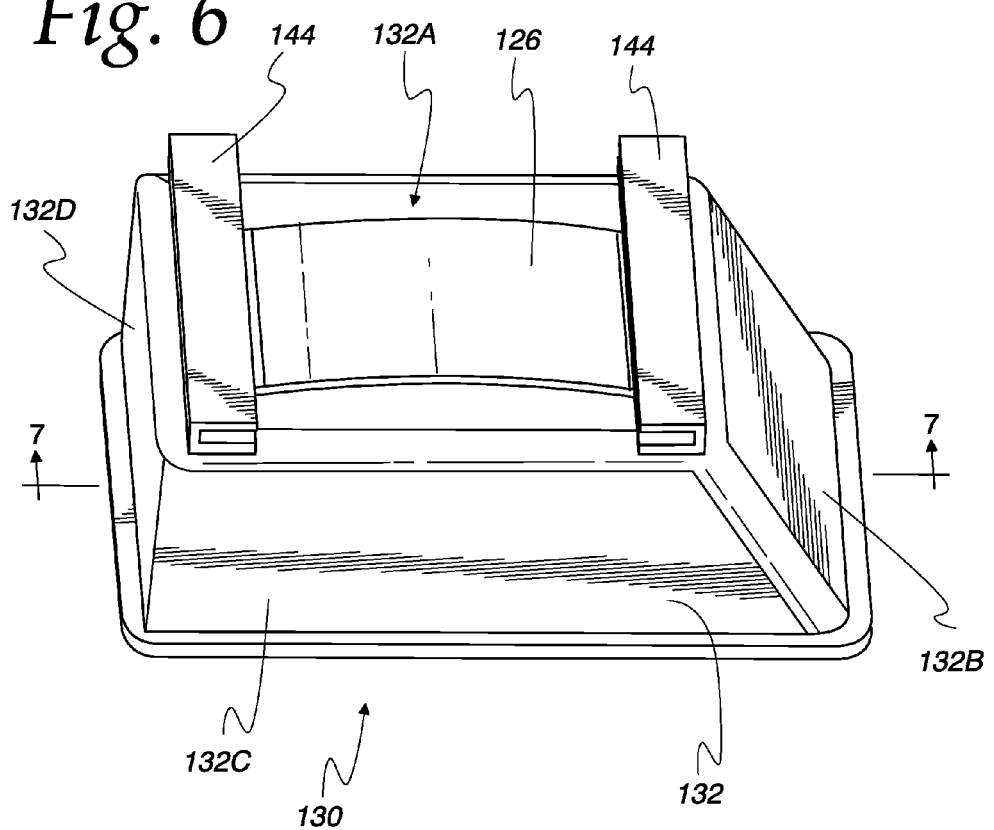
FIG. 6 is a perspective view of touch sensor mechanical assembly 130 showing housing 132 and triggering member 126.
Figure 7:
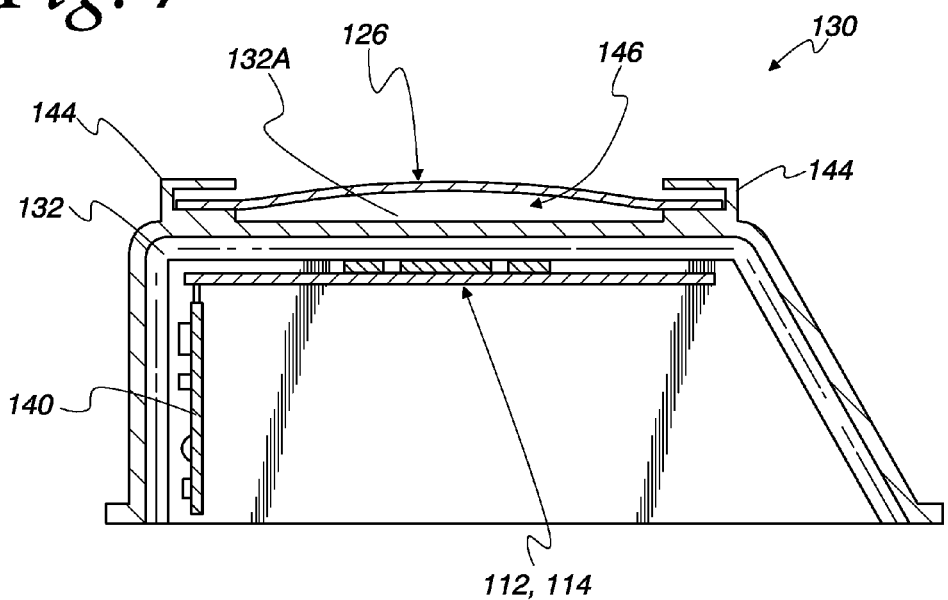
FIG. 7 is a cross-sectional side view of another embodiment of a touch sensor mechanical interface assembly 130 including a housing 132, a touch sensor 112 disposed on an interior portion of housing 132, and a triggering member 126 disposed on the exterior of housing 132.
Figure 8:
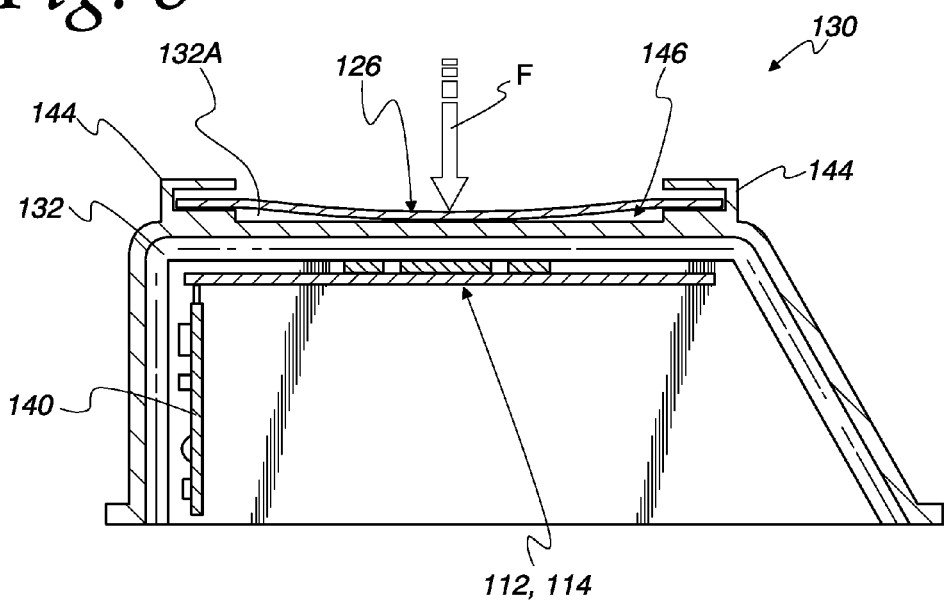
FIG. 8 is a cross-sectional side view of the embodiment shown in FIG. 7 with triggering member 126 in a deflected position.

FIGS. 6-8 illustrate in perspective and cross-sectional side views another embodiment of a touch sensor mechanical interface 130. Interface 130 includes a sensor 112 similar to sensor 12 disposed on a substrate 114 and a triggering member 126 that is movable with respect to touch sensor 112. Substrate 114 is disposed within a housing 132 that preferably is made of plastic or another substantially non-conductive material.

Housing 132 is shown as having a top portion 132A, four side portions 132B-132E and an open bottom. In other embodiments, housing 132 could also have a bottom portion. In embodiments including a bottom portion, the interior of housing 132 could be substantially sealed from the environment. In some embodiments, housing 132 could include tabs 144 or other features for securing triggering member 126 to housing 132. Housing 132 also could include features (not shown) for securing housing 132 to another structure.

Triggering member 126 is shown as a strip of spring steel or other conductive metal, the ends of which are disposed between corresponding tabs 144 such that the portion of triggering member 126 intermediate its ends normally bows away from top portion 132A, thus leaving a space 146 between triggering member 126 and top portion 132A. The intermediate portion of triggering member 126 can be deflected towards top portion 132A in response to a force F applied thereto, as would be recognized by one skilled in the art. In other embodiments, triggering member 126 could take other forms and be made of other materials. For example, triggering member 126 could be embodied as a resilient plastic dome disposed on top portion 132A, the dome having a conductive mass (not shown) disposed therein or thereon. Similar to the intermediate portion of triggering member 126, as described above, this conductive mass would be movable between positions relatively near to and relatively far from top portion 132A and, therefore, sensor 112. Triggering member 126 could, but need not, be connected to ground or another reference potential.

In the foregoing embodiments, triggering member 126 is mechanically unstable in the deflected position so that it returns to its original position in response to the release of force F. As such, triggering member 126 incorporates that functionality of a separate biasing member. In other embodiments, triggering member 126 could be configured so that it is stable in the deflected position and a separate biasing member (not shown) could be provided to bias triggering member 126 to the un-deflected position in the absence of force F.

Sensor 112 is shown as disposed on substrate 114. Substrate 114 can be attached to housing 132 such that touch sensor 112 is near top portion 132 or otherwise adjacent or operably near triggering member 126. Preferably, touch sensor 112 would be in contact with top portion 132A such that there is no air gap between the sensing electrode(s) of touch sensor 112 and top portion 132A. In some embodiments, substrate 114 and touch sensor 112 could be encapsulated within top portion 132A. In other embodiments, substrate 114 could be omitted and touch sensor 112 could be disposed directly on or encapsulated within top portion 132A. Sensor 112 can be electrically coupled to additional circuitry on another substrate 140 disposed within housing 132.

In use, the intermediate portion of triggering member 126 normally is disposed away from housing 132 and, therefore, sensor 112, as shown in FIG. 7. As such, triggering member 126 normally does not substantially couple with the electric field E about the electrodes of sensor 112 and, therefore, does not normally trigger sensor 112. Application of a predetermined force F to the intermediate portion of triggering member 126 causes it to snap or otherwise deflect toward housing 132 and, therefore, toward sensor 112, as shown in FIG. 8. So deflected, the intermediate portion of triggering member 126 substantially couples to the electric field E about sensor 112 and thereby triggers sensor 112. Upon release of force F, triggering member 126 returns towards its original state as shown in FIG. 7.

One skilled in the art would recognize that the embodiments shown and described herein are illustrative and could be modified without departing from the scope of the following claims.

The invention claimed is:

1. An electronic sensor apparatus comprising;
   a non-conductive housing having a floor and a sidewall extending from said floor;
   a touch sensor disposed in said housing in association with said floor of said housing, said touch sensor being responsive to the presence or absence of an object in proximity thereto;
   a triggering member in sliding engagement with an interior surface of said sidewall of said housing, at least a portion of said triggering member being movable between a first position relatively far from said touch sensor and a second position relatively near said touch sensor; and
   a biasing member configured to bias said triggering member toward said first position.

2. The apparatus of claim 1 wherein said biasing member comprises a resiliently compressible member located between said touch sensor and said triggering member.

3. The apparatus of claim 1 wherein said touch sensor comprises a first sensing electrode, a second sensing electrode, and an integral control circuit electrically coupled to and in close proximity to said first and second electrode.

4. The apparatus of claim 3 wherein said first sensing electrode comprises a thin, conductive electrode pad.

5. The apparatus of claim 4 wherein said second sensing electrode comprises a thin, conductive electrode pad in a side-by-side relationship with said first sensing electrode.

6. The apparatus of claim 4 wherein said second sensing electrode comprises a narrow electrode substantially surrounding said first sensing electrode.

7. The apparatus of claim 3 wherein said touch sensor is disposed on said floor of said housing.

8. The apparatus of claim 3 wherein said touch sensor is molded into said housing.

9. The apparatus of claim 1 wherein said triggering element comprises a conductive plate in operable association with said housing.

10. The apparatus of claim 9 wherein said conductive plate is electrically coupled to a reference potential.

11. The apparatus of claim 10 wherein said reference potential is ground.

12. The apparatus of claim 9 wherein said conductive plate comprises a top portion of said housing, said top portion of said housing being movable with respect to said side wall and floor of said housing.

13. The apparatus of claim 2 wherein said compressible member comprises resiliently compressible foam.

14. The apparatus of claim 13 wherein said foam allows for a predetermined amount of compression in response to application of a predetermined force or pressure thereto.

15. The apparatus of claim 1 wherein said biasing member and said triggering together comprise a conductive, resilient spring member operably associated with an exterior of said housing portion.

16. The apparatus of claim 1 wherein said triggering member is configured to receive a force imparted by a loose bulk material and be moved relative to said housing by said force.

17. The apparatus of claim 16 wherein said loose bulk material comprises coffee beans.

18. An electronic sensor apparatus comprising:
a non-conductive housing having a top portion and a side portion extending from said top portion;
a touch sensor disposed in said housing in association with said top portion of said housing, said touch sensor being responsive to the presence or absence of an object in proximity thereto;
a triggering member connected to an exterior portion of said top portion of said housing, said triggering member separated from said touch sensor by said top portion, at least a portion of said triggering member being movable between a first position relatively far from said top portion of said housing and said touch sensor and a second position relatively near said top portion of said housing and said touch sensor; and
means for biasing said triggering member toward said first position.

19. The apparatus of claim 18 wherein said means for biasing comprises a resilient spring member operably associated with an exterior of said housing.

20. The apparatus of claim 19 wherein said triggering member comprises a conductive mass operably associated with said resilient spring member.

21. The electronic sensor apparatus of claim 18 wherein said means for biasing comprises said triggering member.

22. The electronic sensor apparatus of claim 21 wherein said means for biasing is integral with said triggering member.

23. The electronic sensor apparatus of claim 21 wherein said means for biasing is separate from said triggering member.

* * * * *